United States Patent
Kishimoto

(10) Patent No.: US 10,485,112 B2
(45) Date of Patent: Nov. 19, 2019

(54) CERAMIC CIRCUIT SUBSTRATE AND METHOD FOR PRODUCING CERAMIC CIRCUIT SUBSTRATE

(71) Applicant: TANAKA KIKINZOKU KOGYO K.K., Chiyoda-ku, Tokyo (JP)

(72) Inventor: Takaomi Kishimoto, Tomioka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 16/097,383

(22) PCT Filed: Jun. 8, 2017

(86) PCT No.: PCT/JP2017/021247
§ 371 (c)(1),
(2) Date: Oct. 29, 2018

(87) PCT Pub. No.: WO2017/213207
PCT Pub. Date: Dec. 14, 2017

(65) Prior Publication Data
US 2019/0150298 A1    May 16, 2019

(30) Foreign Application Priority Data
Jun. 10, 2016    (JP) ................. 2016-116440

(51) Int. Cl.
*H05K 3/46* (2006.01)
*C22C 5/06* (2006.01)
(Continued)

(52) U.S. Cl.
CPC ......... *H05K 3/4644* (2013.01); *B23K 1/0016* (2013.01); *B23K 35/007* (2013.01);
(Continued)

(58) Field of Classification Search
CPC .. H05K 3/4644; B23K 1/0016; B23K 35/007; B23K 35/0238; B23K 35/3006; B32B 15/018
(Continued)

(56) References Cited

U.S. PATENT DOCUMENTS

2012/0168209 A1    7/2012    Kato
2013/0069213 A1*   3/2013    Sohn ................... H01L 23/3107
                                                257/668

FOREIGN PATENT DOCUMENTS

EP    2811513 A1    12/2014
JP    5-267529 A    10/1993
(Continued)

OTHER PUBLICATIONS

PCT, International Search Report for PCT/JP2017/021247, dated Sep. 12, 2017.
(Continued)

*Primary Examiner* — Tremesha S Willis
(74) *Attorney, Agent, or Firm* — Orrick, Herrington & Sutcliffe LLP; Joseph A. Calvaruso; K. Patrick Herman

(57) ABSTRACT

A ceramic circuit substrate according to the present invention includes a ceramic substrate, a copper circuit made of a copper-based material bonded, via a bonding layer, to a surface of the ceramic, and a copper heat sink made of the copper-based material bonded, via a bonding layer, to the other surface of the ceramic. The bonding layers each include a brazing material component including two or more kinds of metals, such as Ag, and an active metal having a predetermined concentration. The bonding layers each include a brazing material layer including the brazing material component, and an active metal compound layer containing the active metal. A ratio of a bonding area of the
(Continued)

active metal compound layer in a bonding area of each of the bonding layers is 88% or more.

20 Claims, 2 Drawing Sheets

(51) Int. Cl.
*H01L 23/12* (2006.01)
*H05K 1/02* (2006.01)
*H05K 1/03* (2006.01)
*H01L 23/15* (2006.01)
*H01L 23/36* (2006.01)
*H01L 23/498* (2006.01)
*B23K 1/00* (2006.01)
*B23K 35/30* (2006.01)
*C04B 37/02* (2006.01)
*H05K 1/09* (2006.01)
*B23K 35/00* (2006.01)
*B23K 35/02* (2006.01)
*B32B 15/01* (2006.01)
*C22C 5/08* (2006.01)
*C22C 9/00* (2006.01)
*H05K 3/00* (2006.01)
*H05K 3/38* (2006.01)
*B23K 103/12* (2006.01)
*B23K 101/42* (2006.01)
*B23K 35/26* (2006.01)
*B23K 35/28* (2006.01)
*B23K 35/32* (2006.01)

(52) U.S. Cl.
CPC ...... *B23K 35/0238* (2013.01); *B23K 35/3006* (2013.01); *B32B 15/018* (2013.01); *C04B 37/023* (2013.01); *C04B 37/026* (2013.01); *C22C 5/06* (2013.01); *C22C 5/08* (2013.01); *C22C 9/00* (2013.01); *H01L 23/12* (2013.01); *H01L 23/15* (2013.01); *H01L 23/36* (2013.01); *H01L 23/498* (2013.01); *H05K 1/0203* (2013.01); *H05K 1/0271* (2013.01); *H05K 1/0306* (2013.01); *H05K 1/09* (2013.01); *B23K 35/26* (2013.01); *B23K 35/286* (2013.01); *B23K 35/30* (2013.01); *B23K 35/32* (2013.01); *B23K 35/325* (2013.01); *B23K 2101/42* (2018.08); *B23K 2103/12* (2018.08); *C04B 2237/125* (2013.01); *C04B 2237/126* (2013.01); *C04B 2237/127* (2013.01); *C04B 2237/343* (2013.01); *C04B 2237/348* (2013.01); *C04B 2237/36* (2013.01); *C04B 2237/361* (2013.01); *C04B 2237/363* (2013.01); *C04B 2237/365* (2013.01); *C04B 2237/366* (2013.01); *C04B 2237/368* (2013.01); *C04B 2237/407* (2013.01); *C04B 2237/50* (2013.01); *C04B 2237/52* (2013.01); *C04B 2237/60* (2013.01); *C04B 2237/708* (2013.01); *C04B 2237/74* (2013.01); *H05K 3/0061* (2013.01); *H05K 3/388* (2013.01); *H05K 2201/066* (2013.01); *H05K 2203/128* (2013.01)

(58) Field of Classification Search
USPC .......................................... 174/252
See application file for complete search history.

(56) References Cited

FOREIGN PATENT DOCUMENTS

| | | |
|---|---|---|
| JP | H05-267529 A | 10/1993 |
| JP | 2000-151034 A | 5/2000 |
| JP | 2000-323618 A | 11/2000 |
| JP | 2014-90144 A | 5/2014 |
| JP | 2016-074565 A | 5/2016 |
| WO | WO 2011/034075 A1 | 3/2011 |

OTHER PUBLICATIONS

EP, Extended Search Report for European Application No. 17810380.0, dated May 8, 2019.

* cited by examiner

Bonding layer

Ceramic substrate

Ti Kα1

CERAMIC CIRCUIT SUBSTRATE AND METHOD FOR PRODUCING CERAMIC CIRCUIT SUBSTRATE

TECHNICAL FIELD

The present invention relates to ceramic circuit substrates used for power modules, for example. In particular, the present invention relates to a ceramic circuit substrate produced by bonding a copper circuit and a copper heat sink onto a ceramic substrate. The ceramic circuit substrate has bonding areas with secured durability even when the copper circuit and the copper heat sink are made thicker for an improved heat dissipation capability.

RELATED ART

Ceramic circuit substrates using ceramic substrates have been applied as circuit substrates for power modules, such as insulated gate bipolar transistors (IGBTs), used in hybrid cars and power generation facilities, for example. A ceramic circuit substrate is a substrate bonded, on a surface of a ceramic substrate, with a copper circuit made of a copper-based material for coupling with a semiconductor element, and, on the other surface of the ceramic substrate, with a copper heat sink made of the copper-based material for dissipating heat of the semiconductor element.

As described above, a ceramic circuit substrate is produced by bonding a copper circuit and copper heat sink onto a ceramic substrate. In this bonding, by taking into account that different materials, namely a ceramic and a metal (copper), are bonded, active metal soldering is normally applied. The active metal soldering is one aspect of bonding methods through brazing, and is a method for bonding a metal and a ceramic by using an active metal brazing material produced by adding an active metal, such as Ti and Zr, into a brazing material component constituting a brazing material, such as an Ag brazing material. In the active metal soldering, the active metal in the active metal brazing material concentrates on a bonded interface between the brazing material component and the ceramic, allowing oxygen and nitrogen in the ceramic to react to exert a bonding force. Such materials are known that can serve as the active metal brazing material including, for example, an Ag—Cu—Ti based brazing material and an Ag—Cu—Ti—Sn based brazing material.

In producing a ceramic circuit substrate through active metal soldering, paste of a brazing material produced by mixing and dispersing powder of a metal constituting an active metal brazing material into an organic solvent is normally used. For example, to produce an Ag—Cu—Ti-based brazing material, Ag powder and Cu powder serving as brazing material components and Ti powder or Ti compound powder (for example, $TiH_2$ powder) serving as an active metal are mixed into an organic solvent to produce paste of an active metal brazing material. After the paste of the active metal brazing material is applied onto a ceramic substrate, a copper circuit and a copper heat sink are placed onto the paste being formed, and are heated to a predetermined temperature. The powder of the metals in the active metal brazing material then melts to form a bonding layer between the ceramic substrate and the copper circuit (i.e. copper heat sink). The bonding layer includes an active metal compound layer generated as the active metal has moved onto a bonded interface with the ceramic and has thus reacted. The bonding layer has a two-layer structure of the active metal compound layer and a brazing material layer containing, as a primary component, the brazing material component, such as Ag and Cu.

RELATED ART DOCUMENTS

Patent Documents

[Patent document 1] JP 2014-90144 A

SUMMARY

Problems to be Solved by the Invention

In the field of power modules applied with ceramic circuit substrates, improving a heat dissipation capability is addressed as an issue for achieving a higher module output and higher density. For power modules, such as IGBTs, while a size has been reduced, a required output tends to increase. Under this tendency, a temperature of a chip being mounted may rise, requiring a further higher heat dissipation capability more than ever. A method being studied for improving a heat dissipation capability of a module is to thicken a copper circuit and a copper heat sink (thicker copper), in addition to altering a material of a ceramic substrate. Specifically, such a method has been studied that a copper circuit and a copper heat sink are thickened to approximately two or three times of a conventional thickness to achieve thicker copper to increase an amount of dissipation of heat from the expanded areas.

However, according to the inventors, achieving thicker copper would increase a thermal expansion difference between a copper circuit, a copper heat sink, and a ceramic substrate more than ever, deteriorating durability and reliability of bonding areas and the substrate. A copper-based material and a ceramic differ in kind, and greatly differ in thermal expansion coefficient. A thermal expansion difference is a factor of generating thermal stress. A thermal cycle of turning on and off of a module negatively affects to a configuration of a ceramic circuit substrate, in particular, to bonding layers. The issue on thermal stress based on a thermal expansion difference described above has been present in conventional ceramic circuit substrates. However, the issue becomes further prominent as a thermal expansion difference increases through achieving thicker copper. As the thermal expansion difference increases, a load increases, causing a copper circuit and a copper heat sink to peel off, as well as causing a ceramic substrate to crack. With a conventional bonding structure, suppressing such problems as copper peeling off and cracking of a substrate due to when thicker copper is achieved as described above is difficult. To improve a heat dissipation capability in a ceramic circuit substrate, thickening a copper circuit and a copper heat sink to achieve thicker copper is one effective means. However, the means has not yet been fully achieved.

In view of the problems described above, the present invention has an object to provide a ceramic circuit substrate. In the ceramic circuit substrate, neither cracking of the substrate nor copper peeling off would be likely to occur even when a load is received due to a thermal expansion difference between the ceramic substrate and copper. The present invention shows a configuration of a bonding layer particularly advantageous for the problems. The object of the present invention further includes showing a method for producing the ceramic circuit substrate with improved reliability and durability.

Means of Solving the Problems

To solve the problems described above, the inventors first analyzed in detail a configuration of each of bonding layers of a ceramic circuit substrate produced through conventional active metal soldering. As described above, in producing a conventional ceramic circuit substrate, an active metal brazing material in a paste form is supplied onto bonding surfaces of the substrate. In paste of the active metal brazing material, metallic powder of a brazing material component (for example, Ag and Cu) and intermetallic compound powder of an active metal (for example, Ti) are dispersed in a solvent. An active metal brazing material can be easily prepared into a paste form with a good handling property, thereby achieving an excellent bonding workability. Active metal soldering that applies an active metal brazing material in a paste form is mainly used as a method for producing a ceramic circuit substrate.

As described above, a bonding layer formed by melting and solidifying a brazing material in a paste form (powder form) has a two-layer structure of a brazing material layer based on, as a primary component, a brazing material component presenting a solidification structure, and an active metal compound layer formed on an interface with a ceramic substrate. The inventors here focused on a bonding area of an active metal compound layer with a ceramic substrate. A bonding area refers to an area of a region, where a ceramic substrate and an active metal compound layer or a bonding layer abut each other. The inventors evaluated, for a bonding layer formed with paste of a conventional active metal brazing material, a ratio of a bonding area of an active metal compound layer in a bonding area of the whole bonding layer, and confirmed that the ratio was approximately 50% only. A ratio of a bonding area is also addressed in Patent Document 1 described above, disclosing a maximum ratio of 85% as occupancy. In a bonding layer produced through active metal soldering, an active metal compound layer is assumed to be a portion securing bonding between a ceramic substrate and the bonding layer. Accordingly, depending on how the portion is configured, a bonding force between the ceramic substrate and a copper circuit or a copper heat sink differs.

The inventors had assumed that a form of an active metal compound layer in a bonding layer will be further important in circuit substrates for power modules where achieving thicker copper will be further required along with an increasing heating value. However, controlling a form of an active metal compound layer is limited in approach based on a conventional brazing material in a paste form.

The inventors first studied and reviewed bonding of a ceramic substrate onto a copper circuit and a copper heat sink. As a result, the inventors had found that, instead of an active metal brazing material in a paste form produced by mixing metallic powder, when an active metal brazing material in a bulk form having undergone alloying with constituent metals is applied, a bonding layer capable of achieving durability more than ever can be formed. The inventors further studied a configuration of the bonding layer formed at this time and an active metal compound layer in the bonding layer. Finally, the inventors reached the present invention.

That is, the present invention is a ceramic circuit substrate including a ceramic substrate, a copper circuit made of a copper-based material bonded, via a bonding layer, to a surface of the ceramic, and a copper heat sink made of the copper-based material bonded, via a bonding layer, to the other surface of the ceramic. The bonding layers each include a brazing material component made of at least two or more kinds of metals together with Ag serving as an essential component, and at least one or more kinds of components of active metals. The active metals have a content ranging, relative to a metallic element content in each of the whole bonding layers, from 0.5 mass % to 2.0 mass % inclusive. The bonding layers each include a brazing material layer made of the brazing material component, and an active metal compound layer containing the active metal. The active metal compound layer is formed along a bonded interface with the ceramic substrate. Further, a ratio of a bonding area between the active metal compound layer and the ceramic substrate in a bonding area between each of the bonding layers and the ceramic substrate is 88% or greater.

The present invention will now be described in detail. As described above, the ceramic circuit substrate according to the present invention is produced by applying an active metal brazing material having a brazing material component and an active metal alloyed and integrated, and then by bonding a copper circuit and a copper heat sink onto a ceramic substrate under appropriate bonding conditions. Features of the present invention are both of a component composition and a structure of each of the bonding layers. A structural feature of each of the bonding layers is a form of the active metal compound layer formed on each of the bonded interfaces. The feature regarding the component composition of each of the bonding layers, as well as the feature regarding the structure and the form of each of the bonding layers will be respectively described herein. In the present invention, one of the bonding layers is formed between the ceramic substrate and the copper circuit, and the other of the bonding layers is formed between the ceramic substrate and the copper heat sink. The composition and the structure of each of the bonding layers described herein are directed to both of the bonding layers.

(A) Component Composition of Bonding Layer

As for the component composition of each of the bonding layers, metallic elements constituting the bonding layers include at least two or more kinds of brazing material components together with Ag serving as an essential component, and at least one or more kinds of active metals. The components are metallic elements coming from active metal brazing material alloys applied in producing a ceramic circuit substrate.

(A-1) Brazing Material Component

A brazing material component contains two or more kinds of metallic components each capable of melting at a relatively lower temperature through mixing or alloying, and denotes a metal forming a brazing material layer via solidification. The brazing material layer bonds a copper circuit or a copper heat sink and an active metal compound layer to form an integrated ceramic circuit substrate. The brazing material component includes two or more kinds of metals, and denotes a metallic group including at least one combination of metallic materials having a eutectic composition. In the present invention, Ag serves as an essential component in the brazing material component. In active metal soldering, use of a brazing material containing Ag serving as a primary component (silver solder) in a greater amount, and improving of thermal conductivity of a bonding layer have been taken into account.

It is preferable that a metal constituting the brazing material component together with Ag be at least one of Cu, Sn, In, Ni, Si, and Li. In particular, it is preferable that Cu be applied together with Ag. The reason is to secure an ease of fine bonding because a bonding target in the present invention includes a copper-based material. A combination of Ag and Cu has a eutectic composition. The metals are thus appropriate as brazing material components. When Cu is contained as a brazing material component, it is preferable that the content range from 20 weight % to 40 weight % inclusive relative to a whole bonding layer.

At least one of Sn, In, Ni, Si, and Li can be a brazing material component in the present invention. The metals are metallic elements often added for adjusting a material structure of an active metal brazing material alloy provided for bonding. That is, in the active metal brazing material alloy including a brazing material component, an active metal, such as Ti, forms an intermetallic compound (for example, Cu—Ti compound) being dispersed. An intermetallic compound based on an active metal often has higher hardness. Such higher hardness could affect an processability on a brazing material. Even though Sn, In, Ni, Si, and Li are brazing material components, the components show an bondability with an active metal, such as Ti, compared with Ag and Cu, for example. When Sn, In, Ni, Si, or Li is added as a brazing material component, the component preferentially bonds with Ti to generate a finer intermetallic compound. As a result, a material structure of an active metal brazing material alloy can be controlled. With the behavior described above, Sn, In, Ni, Si, or Li may move together with an active metal, such as Ti, and may exist in an active metal compound layer on a bonded interface. Sn, In, Ni, Si, or Li may sometimes form a compound phase together with an active metal dispersed in a brazing material layer. When a bonding layer contains Sn, In, Ni, Si, or Li, it is preferable that a total content of the metal range from 0.1 mass % to 10 mass % inclusive relative to the bonding layer.

(A-2) Active Metal

An active metal is a component for generating an active metal compound layer used to bond a ceramic substrate and a brazing material layer to each other. In bonding, the active metal moves to a bonded interface with the ceramic substrate to react with O, N, and Si, for example, in the ceramic to form an active metal compound layer. The active metal contains at least one metallic element of Ti, Zr, Hf, Nb, Ta, V, Cr, Y, Al, and Mo. The metallic elements are superior in reaction activity with constituent elements of the ceramic, as well as are superior in bondability between the formed active intermetallic compound and a brazing material layer (Ag and Cu). It is particularly preferable that the active metal be Ti or Zr.

In the present invention, a content of the active metal contained in each of the whole bonding layers is restricted in a range from 0.5 mass % to 2.0 mass % inclusive. The content of the active metal ranges narrower than a content of an active metal in a bonding layer formed from an active metal brazing material in either a paste form or a powder form in a conventional technique. That is, the content of the active metal contained in each of the whole bonding layers according to the present invention explicitly differs from the content in the conventional technique.

Why the content of the active metal is relatively low in the present invention is that an alloyed active metal brazing material is used in the present invention. With the active metal brazing material having undergone alloying, even when the content of the active metal is decreased, an active metal compound layer in a state advantageous for a bonded interface can be formed. The reason is that, in an alloy, an active metal and a brazing material component are mixed and bonded with each other in an atomic level, allowing active metal atoms to promptly move to a bonded interface with a ceramic for reaction.

On the other hand, with an active metal brazing material in either a paste form or a powder form, according to the conventional technique, how degree a particle diameter of the powder is made finer, such a particle diameter at an atomic level that can be observed in the alloy cannot be achieved. With a conventional brazing material in a powder form, an active metal cannot move promptly at an atomic level, requiring a greater amount of the active metal to form a compound layer on a bonded interface. As a result, a content of the active metal is higher relative to a whole bonding layer.

When the bonding layers according to the present invention each contain a plurality of active metals, its total amount ranges from 0.5 mass % to 2.0 mass % inclusive. It is further preferable that a content of the active metals range from 1.0 mass % to 2.0 mass % inclusive. The content of the active metals is calculated based on a total mass of metallic elements constituting each of the bonding layers. When forming a bonding layer, the active metals bond with non-metals, such as O, N, and Si, in a ceramic. Therefore, a change in mass along with the bonding is taken into account. However, the change in mass is negligible. In an actual case, the change in mass can be approximated to a concentration of an active metal in an active metal brazing material alloy used in bonding. In distribution of an active metal in a bonding layer, most of the active metal exists on a bonded interface to form a compound layer. However, some of the active metal is distributed inside the bonding layer (brazing material layer).

(B) Structure and Form of Bonding Layer

Each of the bonding layers includes the brazing material layer and the active metal compound layer. Features of the present invention include, in addition to the component composition of each of the bonding layers described above, the structure of each of the bonding layers, in particular, the form of the active metal compound layer formed on each of the bonded interfaces.

(B-1) Brazing Material Layer

The brazing material layer is an alloy layer containing the brazing material component described above. For example, when Ag and Cu are applied as brazing material components, the brazing material layer contains an Ag—Cu alloy. The Ag—Cu alloy has a material structure mixed with an Ag phase or an alloy phase based on Ag serving as a primary component ($\alpha$ phase), and a Cu phase or an alloy phase based on Cu serving as a primary component ($\beta$ phase). When another brazing material component (for example, Sn and In) than Ag and Cu is contained, the brazing material component is allowed to alloy with one of the Ag phase, the $\alpha$ phase, the Cu phase, and the $\beta$ phase described above, or another alloy phase is formed and dispersed in the brazing material layer. Otherwise, an alloy phase is formed with an active metal and dispersed in the brazing material layer.

(B-2) Form of Active Metal Compound Layer

The active metal compound layer means a compound in a layer form generated when an active metal, such as Ti, and O, N, and Si, for example, in a ceramic bond with each other. The active metal compound layer optionally contains at least one of Sn, In, Ni, Si, and Li serving as an additive. Therefore, components of the active metal compound layer are not constant, and vary depending on a kind of a ceramic to be bonded and an amount of an additive element. In the present invention, to define the active metal compound layer, the active metal compound layer essentially contains an active metal to serve as a compound layer abutting a bonded interface. In the present invention, all active metals contained in each of the bonding layers do not always form a compound layer on an interface. Some of the active metals may form a compound phase dispersed inside the brazing material layer. Such a dispersing compound phase does not correspond to the active metal compound layer according to the present invention based on the definition described above.

In the present invention, the active metal compound layer is concentrated around each of the bonded interfaces to allow the active metal compound layer to cover a wider range to increase a bonding force. Specifically, a ratio of a bonding area by the active metal compound layer in a bonding area by each of the bonding layers is specified to 88% or greater. The active metal compound layer is a layer for securing a bondability between a ceramic and a metal (brazing material layer), such as Ag and Cu, as well as is a layer for bonding a ceramic substrate and a copper circuit or a copper heat sink. The present invention has an object to improve more than ever durability of a bonding layer against a load due to thermal stress based on a thermal expansion difference between a substrate and copper. Specifically, by assuming a load when thicker copper is achieved in a copper circuit, for example, and when a heating value of a semiconductor element increases, a ratio of a bonding area of an active metal compound layer in an area of a whole bonded interface is specified as an index for preventing a bonding layer from being damaged due to the load. The area of the whole bonded interface denotes a bonding area by a bonding layer, as well as denotes a contact area between the bonding layer and a ceramic substrate. The bonding area of the active metal compound layer denotes a contact area between the active metal compound layer and the ceramic substrate.

According to the inventors, when a ratio of a bonding area between an active metal compound layer and a ceramic substrate in a bonding area between a bonding layer and the ceramic substrate is lower than 88%, an endurance time becomes insufficient when a load due to repetitive thermal stress is applied onto a circuit substrate. It is obviously preferable that a ratio regarding the bonding area be higher as much as possible. Realistically, an upper limit of the ratio may be approximately 95%. Around the upper limit, extremely higher durability can be expected.

For measurement of a ratio of a bonding area between an active metal compound layer and a ceramic substrate in a bonding area between a bonding layer and the ceramic substrate, it is not necessary to limit methods in any particular way, as long as the methods are capable of measuring and estimating a bonding area. In an example measuring method, a circuit substrate can be cross-section observed for a desired portion including a bonding layer to measure a width (length) of the bonding layer being in contact with a bonded interface and a width (length) of an active metal compound layer. The ratio between the widths (lengths) can be regarded as a ratio of the bonding area.

FIG. 1 illustrates a specific example of the method of measuring, through cross-section observation, a ratio of a bonding area between an active metal compound layer and a ceramic substrate in a bonding area between a bonding layer and the ceramic substrate. To study a ratio of a bonding area of an active metal compound layer, as illustrated in FIG. 1, a plurality of desired partial cross sections of a bonding layer can be observed to each measure a width of the bonding layer in an observation visual field and a width of an active metal compound layer to adopt an average value of ratios obtained from the measurements (see FIG. 1 (a)). For a whole bonding layer, desired cross sections may be observed to each measure a width of the whole bonding layer and a width of an active metal compound layer to calculate ratios to adopt an average value (FIG. 1 (b)). In the cross-section observation, when the active metal compound layer is divided, a width of each of the divided active metal compound layers is measured ($I_1$ and $I_2$ in FIGS. 1 (a) and (b)). The resultant sum is regarded as a width of the active metal compound layer. A ratio relative to a width of a bonding layer is then calculated. When observing a bonding layer wholly or partially as described above, it is preferable that elements in a cross section be analyzed to determine whether an active metal is present to identify an active metal compound layer to measure its width. FIG. 1 illustrates an example study in a bonding layer between a copper circuit and a ceramic substrate. A bonding layer between a copper heat sink and the ceramic substrate can be similarly studied.

The present invention further clarifies how much a thickness of an active metal compound layer can advantageously range. That is, it is preferable that, in the present invention, a thickness of an active metal compound layer in a bonding layer on a circuit substrate range from $1/40$ to $1/10$ inclusive relative to a thickness of the whole bonding layer. As can be seen from the numerical value range, in the present invention, an active metal compound layer can be a significantly thinner layer relative to a whole bonding layer. The active metal compound layer being relatively thinner in the present invention as described above is derived from a lower content of the active metal in the bonding layer. The reason the range for a thickness of an active metal compound layer is specified as described above is that, when a thickness is smaller than $1/40$, a bonding force would not be fully exerted between a ceramic and a metal (brazing material layer). On the other hand, even when a thickness exceeds $1/10$, no significant difference arises in the bonding force. It is preferable that a thickness of an active metal compound layer range from $1/40$ to $1/20$ inclusive relative to a whole bonding layer.

As described above, on the ceramic circuit substrate according to the present invention, the significantly thinner active metal compound layer is formed on the bonded interface with a higher area ratio (occupancy) in each of the bonding layers. The reason the active metal compound layer being formed is smaller in thickness, but wider in area, in the present invention, is that the alloyed active metal brazing material is applied. As described above, in an active metal brazing material alloy, an active metal in an atomic level promptly moves to a bonded interface to densely cover the bonded interface to form a compound phase with a ceramic substrate. A lower content of the active metal makes its thickness thinner. However, by covering the bonded interface with higher efficiency, a highly durable bonding layer is formed.

Opposite to the thickness of the active metal compound layer described above, a thickness of a whole bonding layer is not particularly limited, but can be adjusted depending on a thickness and a volume of an active metal brazing material to be used. However, to reduce a height of a circuit substrate as much as possible, but to secure a bonding force, it is preferable that a bonding layer range from 5 μm to 50 μm inclusive.

It is preferable that, in the present invention, a bonding layer is less void, and is dense. The term "void" used here denotes a relatively finer space (cavity). A void contains no metal. An excessive number of voids negatively affects strength of a bonding layer. Repetitive thermal expansion and contraction of a gas in a void may induce cracking on an area around the void. Therefore, voids are not preferable even at a smaller number. Specifically, it is preferable that porosity be 5% or lower. It is obviously most preferable that porosity be 0%. Porosity can be calculated by structurally observing desired cross sections of a bonding layer, and by measuring an area ratio of cavity based on images, for example. Porosity can be easily measured through ultrasonic inspection.

(C) Ceramic Substrate

As described above, the present invention provides a bonding layer formed with an active metal compound layer in an advantageous form to achieve a highly durable ceramic circuit substrate capable of suppressing copper peeling off and cracking of the substrate. A constituent material of the ceramic substrate is not particularly limited, but any one of aluminum nitride, silicon nitride, alumina, zirconia, lanthanum boride, boron nitride, silicon carbide, and graphite is preferable. A thickness of a ceramic substrate is not particularly specified. By taking into account a heat dissipation property required for a module to be used, a thickness of a ceramic substrate can be appropriately selected.

(D) Copper Circuit and Copper Heat Sink

The copper circuit and the copper heat sink to be bonded to the ceramic substrate are each made of a copper-based material. The copper-based material denotes copper or a copper alloy. Copper includes pure copper, oxygen-free copper, and tough pitch copper, for example. The copper alloy includes a Cu—Mo alloy and a Cu—Fe—P alloy, for example.

Thicknesses of the copper circuit and the copper heat sink are not limited in the present invention. As described above, for a ceramic circuit substrate for a power module, achieving thicker copper has been demanded for an improved heat dissipation capability. To respond to the demand, a copper circuit and a copper heat sink tend to be made thicker. Specifically, a copper circuit and a copper heat sink are demanded to be thicken from around 0.4 mm used so far to a range from 0.8 mm to 1.2 mm inclusive. The present invention can also satisfy the demand of achieving thicker copper.

A thickness of a copper circuit and a thickness of a copper heat sink may be identical to each other or may differ from each other. However, if respective volumes differ from each other, heat dissipation capabilities of the front and the back of a circuit substrate differ from each other. In particular, a copper heat sink normally has a flat plate shape. On the other hand, a copper circuit to be mounted with a semiconductor element is formed in conformity to a structure of the semiconductor element. When thicknesses of a copper circuit and a copper heat sink each have a volume ratio (copper circuit/copper heat sink) ranging from 0.5 to 2 inclusive, a circuit substrate with a uniform heat dissipation capability and well thermal expansion valance can be achieved.

(E) Method for Producing Ceramic Circuit Substrate, According to the Present Invention Next, a method for producing a ceramic circuit substrate, according to the present invention, will be described hereinafter. As repeatedly described above, in the present invention, when bonding a copper circuit and a copper heat sink onto a ceramic substrate, an active metal brazing material in a bulk form having a brazing material component and an active metal alloyed is used. In supplying the active metal brazing material in a bulk form, a bonded (clad) composite material with the active metal brazing material on each of copper plates to be formed into the copper circuit and the copper heat sink can be prepared beforehand and used to efficiently produce the circuit substrate.

That is, the method for producing a circuit substrate, according to the present invention, includes preparing a clad composite material containing, on a surface of a copper plate material including a copper-based material, an active metal brazing material having a brazing material component and an active metal alloyed, arranging the composite material on both of surfaces of a ceramic substrate to allow the active metal brazing material to abut the surfaces, and heating the composite material to melt the active metal brazing material to bond the copper plate material onto both of the surfaces of the ceramic substrate.

As described above, the method for producing the ceramic circuit substrate, according to the present invention, focuses on utilizing a clad composite material produced with an active metal brazing material and a copper plate, and bonding the clad composite material onto a ceramic substrate under appropriate bonding conditions. The composite material will be described hereinafter.

As the copper plate constituting the composite material, the plate material including the copper-based material described above is used. A thickness and a size of the copper plate can be identical to a thickness and a size of each of a copper circuit and a copper heat sink on a ceramic circuit substrate to be produced.

The clad active metal brazing material onto the copper plate should be referred to as a precursor of a bonding layer including the brazing material layer and the active metal compound layer. As described above, the clad active metal brazing material includes a brazing material component including at least two or more kinds of metals together with Ag serving as an essential component, and at least one or more kinds of active metals. It is preferable that brazing material component other than Ag be at least one of Cu, Sn, In, Ni, Si, and Li. The active metal contains at least one of Ti, Zr, Hf, Nb, Ta, V, Cr, Y, Al, and Mo. When the active metal brazing material contains Cu, it is preferable that a ratio of Cu relative to the active metal brazing material range from 20 weight % to 40 weight % inclusive. When the active metal brazing material contains at least one of Sn, In, Ni, Si, and Li, it is preferable that its total content relative to the active metal brazing material range from 0.1 mass % to 10 mass % inclusive. Further, it is preferable that a content of the active metal relative to the active metal brazing material range in total from 0.5 mass % to 2.0 mass % inclusive. It is further preferable that the content range from 1.0 mass % to 2.0 mass % inclusive.

A specific composition of the active metal brazing material is, for example, an Ag—Cu—Ti alloy (Cu: from 20 mass % to 40 mass % inclusive, Ti: from 0.5 mass % to 2 mass % inclusive, and Ag: the rest), an Ag—Cu—Ti—Sn alloy (Cu: from 20 mass % to 40 mass % inclusive, Ti: from 1.0 mass % to 2.0 mass % inclusive, Sn: from 1.2 mass % to 6.0 mass % inclusive, and Ag: the rest), or an Ag—Cu—Ti—Zr—Sn alloy (Cu: from 20 mass % to 40 mass % inclusive, Ti: from 1 mass % to 2 mass % inclusive, Zr: from 0.2 mass % to 2.0 mass % inclusive, Sn: from 1.2 mass % to 6.0 mass % inclusive, and Ag: the rest). When the active metal brazing material described above is melted and solidificated, the material can form a bonding layer. Therefore, when the active metal brazing material is applied, a bonding layer contains at least one of the Ag—Cu—Ti alloy, the Ag—Cu—Ti—Sn alloy, the Ag—Cu—Ti—Zr—Sn alloy, the Ag—Cu alloy, the Ag—Cu—Sn alloy, and the Ag—Cu—Zr alloy.

In the specific examples described above, it is particularly preferable that the Ag—Cu—Ti—Sn alloy (Cu: from 20 mass % to 40 mass % inclusive, Ti: from 1.0 mass % to 2.0 mass % inclusive, Sn: from 1.2 mass % to 6.0 mass % inclusive, and Ag: the rest) satisfy a relationship represented as Sn/Ti between an amount of an active metal of Ti and an amount of an additive element of Sn falling within a range from 1.2 to 5.0 inclusive. By controlling Sn/Ti, an processability on a clad active metal brazing material can be secured. As a result, a thinner active metal brazing material can be achieved.

It is preferable that a thickness of the active metal brazing material in the composite material range from 5 μm to 50 μm inclusive. If the thickness is less than 5 μm, a brazing material lacks, preventing a bonding layer with enough bondability from being formed. If the thickness exceeds 50 μm, a lower-height circuit substrate cannot be achieved. A brazing material would be likely to protrude longer as well. A form of a clad active metal brazing material on a copper plate is not particularly specified. However, it is preferable that a clad active metal brazing material expands over a whole surface of a copper plate.

A produced composite material is a raw material integrated with an active metal brazing material and a copper plate serving as a copper circuit or a copper heat sink. The composite material can be further machined. For example, an ordinary copper heat sink is a rectangular flat plate. Such a copper heat sink can be often achieved by producing a composite material in a flat plate shape, and bonding the composite material as is onto a ceramic substrate. On the other hand, a copper circuit is required to be formed into a circuit shape conforming to a semiconductor chip, for example, to be mounted. A composite material applied in the present invention can be machined into a circuit shape through pressing and punching before bonded onto a ceramic substrate.

As described above, one of advantages of the present invention is to use a composite material having a planar shape machined into a circuit shape and to be bonded to a surface of a ceramic substrate. That is, a brazing material in a paste form, according to a conventional technique, has a flow property, making it difficult to adjust and fix a shape of the brazing material before bonding a copper circuit having a complex shape. Therefore, to form a copper circuit through a conventional method, after a copper plate having a planar shape is bonded onto a ceramic substrate, the copper plate is etched to form a circuit in general. However, it is assumed that a chemical or electrochemical metal dissolution process, such as etching, would face difficulty in achieving thicker copper expected in the future. On the other hand, a composite material used in the present invention is a metal in a solid shape, allowing forming and machining through pressing and punching, for example. Such processing can be performed before bonding onto a ceramic substrate. Therefore, efficiency in producing a ceramic circuit substrate can be greatly improved.

With the method for producing a ceramic circuit substrate, according to the present invention, as described above, a produced and prepared composite material is arranged on each of surfaces of a ceramic substrate. The composite material is then heated for bonding. Conditions for the bonding using an active metal brazing material are required to cause the configuration (thickness and bonding area of the active metal compound layer) of the bonding layer described above to appear.

In the conditions for bonding a composite material onto a ceramic substrate, its atmosphere is a vacuum atmosphere ($1\times10^{-2}$ Pa or lower) or an inert gas atmosphere. A required bonding temperature falls within a range from +15° C. to +25° C. inclusive with respect to a melting point of the active metal brazing material. The bonding temperature represents a temperature for the active metal brazing material, as well as represents a temperature for a bonding-target material. Under such a stringent condition control, a bonding layer having an advantageous configuration described above is formed. In bonding of a composite material, heating is sufficient when an active metal brazing material is heated to the temperature described above. However, for purpose of convenience, the composite material and a ceramic substrate may both be subject to the atmosphere described above.

As described above, by bonding a composite material and a ceramic substrate, a ceramic circuit substrate can be produced. As described above, by forming and machining a composite material serving as a copper circuit into a circuit shape before bonded onto a ceramic substrate, a circuit substrate provided with the copper circuit can be promptly produced. However, this does not negate such a process that a composite material having a planar shape is bonded onto a ceramic substrate, and then a copper circuit is formed through etching, for example. In the ceramic circuit substrate, and the method for producing the ceramic circuit substrate, according to the present invention, a thickness of a copper circuit is not limited. The reason is that, depending on how a copper circuit is made thinner or is shaped, bonding of a composite material and a ceramic substrate, and then performing etching might be efficient.

Effects of the Invention

As described above, in the ceramic circuit substrate according to the present invention, a component composition and a structure of a bonding layer are optimized, and accordingly durability of the bonding layer is improved, suppressing a copper circuit and a copper heat sink from peeling off, as well as suppressing the substrate from cracking, even under thermal stress and thermal cycles. The configuration of the bonding layer cannot be achieved through forming with a conventional technique. The reason is that the alloyed active metal brazing material, which has not yet been conventionally used in the field of producing a ceramic circuit substrate, has been appropriately used. In producing the ceramic circuit substrate according to the present invention, a clad composite material with the active metal brazing material and a copper plate serving as a copper circuit or a copper heat sink is prepared beforehand and applied. Therefore, the ceramic circuit substrate can be efficiently produced.

MODES FOR CARRYING OUT THE INVENTION

First Embodiment

Figure 1:
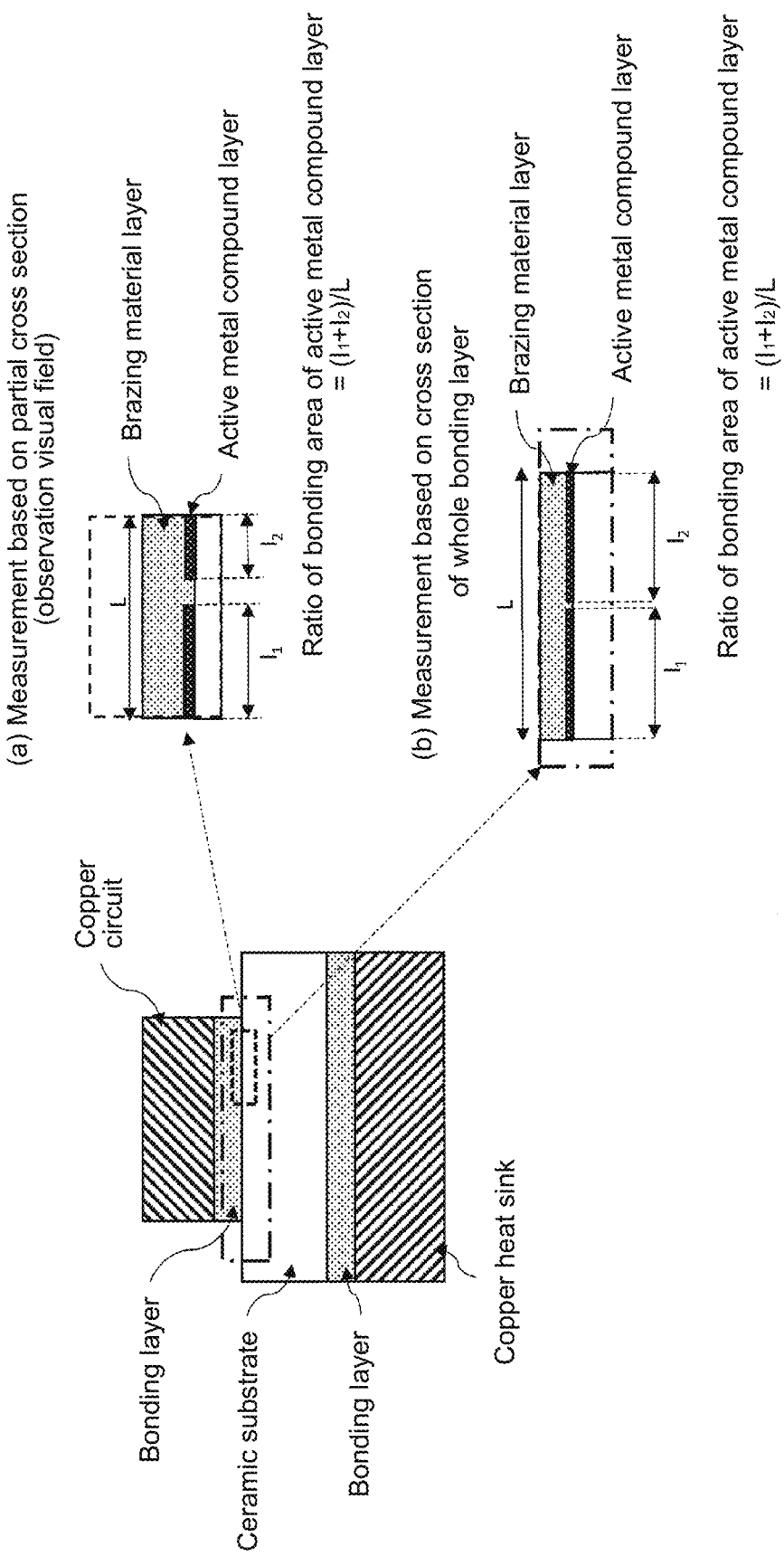
FIG. 1 is a view of an example method for measuring a ratio of a bonding area of an active metal compound layer in a bonding area of a bonding layer.

An embodiment of the present invention will now be described with reference to an example described below. In the embodiment, a ceramic circuit substrate including a copper circuit and a copper heat sink each having a thickness of 0.8 mm was produced. A configuration of each of bonding layers was studied. Thermal durability of the ceramic circuit substrate was further evaluated. In producing the ceramic circuit substrate, a clad composite material with a copper plate and an active metal brazing material was first produced. The clad composite material was then bonded onto a ceramic substrate.

[Producing Composite Material]

In the embodiment, as the active metal brazing material, an Ag—Cu—Ti—Sn alloy (Cu: 28.0 mass %, Ti: 2.0 mass %, and Sn: 5.0 mass %) was produced. The alloy was then machined into a tape material. The tape material was then clad-bonded onto a copper plate. In producing the active metal brazing material, an alloy ingot having the composition described above was produced through melting and casting. The ingot was subjected to a plurality of times of a combination of annealing and cold rolling. The tape-shaped active metal brazing material was thus produced. The produced, tape-shaped active metal brazing material and the prepared, tape-shaped copper plate (made of oxygen-free copper) were clad-bonded through rolling. The tape-shaped clad material was cut to produce the composite material. The composite material had a size of 20 mm×20 mm. A thickness of the active metal brazing material was 20 µm. A thickness of the copper plate was 0.8 mm.

[Producing Ceramic Circuit Substrate]

As the ceramic substrate, a substrate including silicon nitride ($Si_3N_4$) (21 mm×21 mm, thickness: 0.32 mm) was used. On both of surfaces of the ceramic substrate, the composite material produced as described above was secured, and then bonded in a vacuum furnace. Bonding conditions were set to a vacuum atmosphere ($3 \times 10^{-3}$ Pa) and a bonding temperature of 790° C. (Melting point of brazing material+20° C.). After the bonding temperature was attained, the composite material was held in the vacuum furnace for 20 minutes. After heated, the composite material was cooled. The ceramic circuit substrate was thus produced. In the produced ceramic circuit substrate, a thickness of each of the bonding layers was 20 µm.

Comparative Example

To compare with the ceramic circuit substrate produced in the first embodiment, a ceramic circuit substrate was produced using an active metal brazing material in a paste form. The active metal brazing material in a paste form used in the comparative example consisted of Ag—Cu alloy powder and Sn powder, and, further, $TiH_2$ powder dispersed in an organic solvent. A particle diameter of each of metallic powder and compound powder was a sieve aperture of 45 µm or smaller. A composition ratio of the metals was set to Cu: 27 mass %, Ti: 2 mass %, Sn: 3 mass %, and Ag: the rest. The brazing material in a paste form described above was applied onto a ceramic substrate ($Si_3N_4$) (Application area: 20 mm×20 mm), identical to the embodiment. Next, on surfaces of the brazing material in a paste form being applied, copper plates including oxygen-free copper (Thickness: 0.8 mm), identical to the embodiment, were placed. After that, the ceramic substrate was held for 20 minutes at a temperature of 790° C. to bond the copper plates to produce the ceramic circuit substrate.

[Checking Structure of Bonding Layer]

Figure 2:
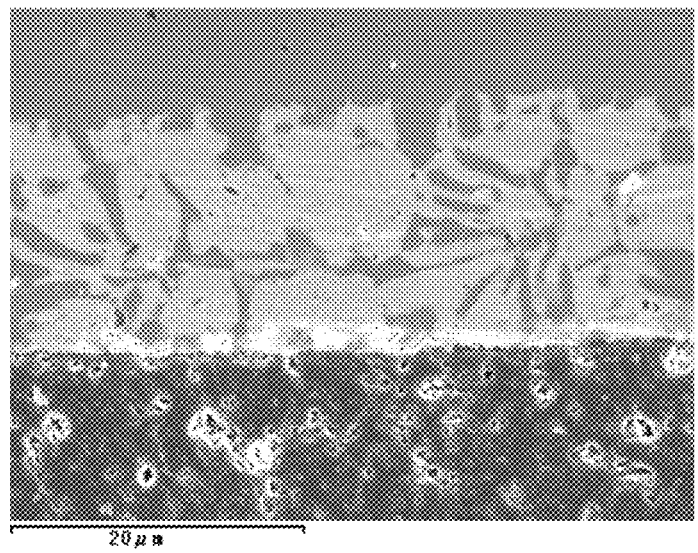
FIG. 2 is a photo of a cross section of a bonding layer of a ceramic circuit substrate produced in the embodiment.
Figure 3:
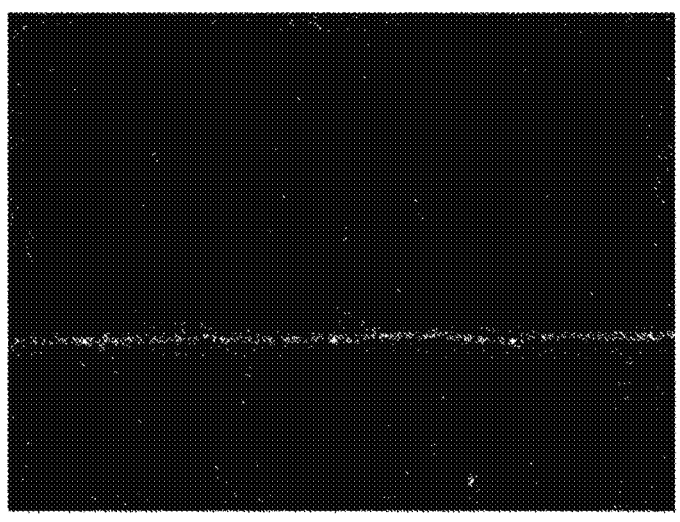
FIG. 3 is a Ti mapping image in an EDX analysis on the bonding layer of the ceramic circuit substrate produced in the embodiment.

Structures of cross sections of bonding layers on the produced ceramic circuit substrate were SEM-observed. As an example, FIG. 2 illustrates a photo of a cross section around the bonding layer between the ceramic substrate and the copper circuit. Next, the cross sections of the bonding layers were EDX-analyzed. In the EDX analysis, a magnification was set to 500 times, and an acceleration voltage was set to 15 kV. Interfaces between the bonding layers and the ceramic substrate were analyzed. At this time, a plurality of locations on the two bonding layers (the bonding layer between the ceramic substrate and the copper circuit, and the bonding layer between the ceramic substrate and the copper heat sink) were analyzed. As an example result of analysis, FIG. 3 illustrates a result of mapping on Ti. As can be seen in FIG. 3, on the interface on a ceramic substrate side of each of the bonding layer, presence of a layer was confirmed. In the layer, Ti was enriched. The layer was identified as an active metal compound layer. In the EDX analysis, elements of Ag, Cu, Sn, Si, and N were analyzed. It was confirmed that, on the active metal compound layer in each of the bonding layers (direction toward the copper circuit or the copper heat sink), a brazing material layer including a brazing material component made of Ag, Cu, and Sn was formed.

By utilizing the result of the EDX analysis described above, bonding areas of the active metal compound layers were calculated. In the embodiment, based on the Ti mapping image shown in FIG. 3, widths of the active metal compound layers were regarded as the bonding areas of the metal compound layers, and were measured. In the mapping image used in the embodiment, a number of pixels was 192 pixels×256 pixels. One pixel=approximately one µm. Therefore, an observation visual field corresponded to 192 µm×256 µm. To measure the widths of the active metal compound layers, a portion without containing Ti on the interface between each of the bonding layers and the ceramic (portion colored in black in FIG. 3) was determined as a region without including the active metal compound layer. A total of the widths (number of pixels) of the regions without including the active metal compound layer was subtracted from the number of pixels (256 pixels) in a horizontal width of the whole image. The result was regarded as the width of the active metal compound layer. Further, the width of the active metal compound layer was divided by the horizontal width of the whole image. The result was regarded as a ratio of the bonding area of the active metal compound layer.

In the embodiment, the produced ceramic circuit substrate (Planar size of bonding layer: 20 mm×20 mm) was cut across into four specimens (Planar size of bonding layer: 20 mm×5 mm). The specimens were embedded in resin and polished to produce four samples for use in cross-section observation. In ten visual fields, regions of the samples were analyzed and measured as described above (N=40). As a result, in the embodiment, the ratio of the bonding area between the active metal compound layer and the ceramic substrate in the bonding area between each of the bonding layers and the ceramic substrate was 93%.

Thicknesses of the active metal compound layers on the bonded interfaces of the circuit substrate produced in the embodiment were further measured. In the thickness measurement, an EDX analysis was performed with a magnification of 3000 times. For regions containing Ti, thicknesses were measured at a plurality of desired locations. An average value of the thicknesses was calculated. The average value was regarded as a thickness of each of the active metal compound layers. In the embodiment, an average of the thicknesses of each of the active metal compound layers was 0.80 µm. A ratio of the thickness of each of the active metal compound layers relative to each of the whole bonding layers was 0.04.

Further, for all surfaces of the bonding layers of the ceramic circuit substrate according to the embodiment, a surface inspection through ultrasonic inspection (Equipment name: Hitachi UTS100C) was performed. As a result, porosity was 0%. It was confirmed that the bonding layers were finer and did not include voids.

On the other hand, in the comparative example, a structure itself of each of the bonding layers was approximately identical to a structure of each of the bonding layers in the embodiment. Brazing material layers and active metal compound layers were observed. With a method similar to the method in the embodiment, a ratio of each of bonding areas on active metal compound layers in a bonding area of each of bonding layers was calculated. The calculated ratio was 58%. A thickness of each of the active metal compound layers was 0.6 µm. Further, a surface inspection through ultrasonic inspection was performed. As a result, porosity was 10%.

[Evaluation of Durability]

Next, a thermal cycling test was performed on the ceramic circuit substrates according to the embodiment and the comparative example to evaluate durability of the bonding layers. In the thermal cycling test for the embodiment, holding the ceramic circuit substrate under a low temperature range (−50° C.) and a high temperature range (150° C.) respectively for 30 minutes for heating and cooling was specified as one cycle. In the test, the cycle was repeated 1000 times. The ceramic circuit substrate having undergone the test 1000 cycles was evaluated with an ultrasonic detector for whether a copper plate was peeled off.

The thermal cycling test was performed with N=2. In the ceramic circuit substrate according to the embodiment, no 100% peeling off was observed in the tests. On the other hand, in the ceramic circuit substrate according to the comparative example, 100% peeling off was observed when N=2. A conceivable factor is a lower ratio of a bonding area of the active metal compound layer in a bonding area of one of the bonding layers according to the comparative example.

Second Embodiment

Here, a plurality of active metal brazing materials respectively having different compositions were used to produce circuit substrates. Similar to the first embodiment, the active metal brazing materials respectively having compositions in Table 1 described below were produced to produce composite materials. The circuit substrates were produced in a similar manner to the first embodiment.

In the embodiment, bonding conditions similar to the bonding conditions applied in the first embodiment were basically applied. In some examples (No. 2 and No. 7), thicknesses of the active metal brazing materials were reduced from the thickness of the active metal brazing material according to the first embodiment (15 µm), while a set bonding temperature was increased (Melting point of brazing material+25° C.).

For the produced circuit substrates, an appearance evaluation was first performed. Whether the bonding layers were peeled off and whether the brazing materials raised upward were checked. Similar to the first embodiment, cross sections of the bonding layers were observed. Thicknesses of the bonding layers and thicknesses of the active metal compound layers were measured (for average values). Ratios between the thicknesses were calculated.

For the circuit substrates having passed the visual inspection, similar to the first embodiment, a ratio of a bonding area between the active metal compound layer and each of the ceramic substrates in a bonding area between each of the bonding layers and each of the ceramic substrates was measured (N=40). A surface inspection through ultrasonic inspection was further performed to measure porosity.

Similar to the first embodiment, a thermal cycling test was performed for evaluating durability of the bonding layers. Test conditions similar to the test conditions applied in the first embodiment were applied. In the embodiment, the thermal cycling test was performed with N=3. Ceramic substrates where no 100% peeling off was observed were evaluated as acceptable "○", while ceramic substrates where peeling off was observed were evaluated as unacceptable "x". Table 1 illustrates the result of the study described above.

TABLE 1

| | Composition of brazing material (mass %) | | | | Thickness of brazing material | Thickness of bonding layer | Active metal compound layer | | Evaluation of bonding layer | | | |
|---|---|---|---|---|---|---|---|---|---|---|---|---|
| No. | Ag | Cu | Ti | Sn | (µm) | (µm) | Thickness (µm) | Ratio | Appearance | Ratio of bonding area | Porosity | Durability |
| 1 | Balance | 28.0 | 1.8 | 5.0 | 20 | 20 | 0.82 | 0.041 | ○ | 90% | 0% | ○ |
| 2 | | | | | 15 | 16 | 0.43 | 0.027 | ○ | 88% | 0% | ○ |
| 3 | | | | | 3 | 44 | 0.17 | 0.043 | Peeling off | — | — | — |
| 4 | | | | | 55 | 52 | 1.52 | 0.029 | Raising upward | — | — | — |
| 5 | | 29.5 | 1.3 | 3.0 | 20 | 22 | 0.65 | 0.030 | ○ | 92% | 0% | ○ |
| 6 | | 29.0 | 0.8 | 2.0 | 20 | 21 | 0.58 | 0.028 | ○ | 88% | 5% | ○ |
| 7 | | | | | 15 | 18 | 0.45 | 0.025 | ○ | 85% | 10% | X |
| 8 | | 29.7 | 0.3 | 1.0 | 20 | 24 | 0.13 | 0.005 | Peeling off | — | — | — |

For No. 2 and No. 7, a bonding temperature was set to a melting point of brazing material + 25° C. For other examples, a bonding temperature was set to a melting point of brazing material + 20° C.

First, as production conditions, it was confirmed that a thickness of a brazing material should be taken into account during production, because, when the thickness of the active metal brazing material is too thinner or too thicker (No. 3 and No. 4), a bonding layer will be peeled off or the brazing material will rise upward. When a content of an active metal (Ti) in the active metal brazing material was less than 0.5 mass %, a content of the active metal in a bonding layer was insufficient, leading to peeling off (No. 8). In this case, a thickness of the active metal compound layer was extremely thinner.

For the circuit substrates having passed the visual inspection, results of durability tests were almost acceptable.

However, in one of the circuit substrates, a ratio of a bonding area between the active metal compound layer and the ceramic substrate in a bonding area between each of the bonding layers and the ceramic substrates was below 88%, and peeling off was observed (No. 7). The circuit substrate was unacceptable because peeling off was observed once in the test for N=3. In the circuit substrate of No. 7, a set Ti concentration in the active metal brazing material was lower than Ti concentrations set in the first embodiment and the example of No. 2. A thickness of the brazing material was slightly reduced, while a bonding temperature was set higher. With comprehensive actions of the conditions, in the circuit substrate of No. 7, formation of an active metal compound layer was identified. However, it is conceivable that a ratio of a bonding area on an interface with the ceramic substrate was insufficient. In the circuit substrate of No. 7, porosity was not so high, according to a result of the ultrasonic inspection. On the other hand, as a result of the durability test, peeling off was observed. In other words, to strictly achieve higher durability, it has been confirmed that, in addition to evaluating a bonded interface for whether voids are present, studying a bonding area of an active metal compound layer is preferable.

INDUSTRIAL APPLICABILITY

In the ceramic circuit substrate according to the present invention, durability and a bonding force of a bonding layer to a ceramic substrate are improved. Even under thermal stress or thermal cycles, a copper circuit and a copper heat sink are suppressed from being peeled off, as well as the substrate is suppressed from cracking. The present invention is advantageous as a circuit substrate for various kinds of power modules used in hybrid cars, vehicles, and power generation facilities, for example. The present invention is also applicable to expected power modules with higher density and a higher output.

The invention claimed is:

1. A ceramic circuit substrate comprising:
    a ceramic substrate;
    a copper circuit made of a copper-based material bonded, via a first bonding layer, to a surface of the ceramic substrate; and
    a copper heat sink made of the copper-based material bonded, via a second bonding layer, to the other surface of the ceramic substrate,
    wherein the bonding layers each include a brazing material component comprising at least two or more kinds of metals together with Ag and Cu serving as essential components, at least one active metal, the active metal, in the bonding layers, having a content ranging, relative to a metallic element content in each of the whole bonding layers, from 0.5 mass % to 2.0 mass % inclusive, and the Cu, in each of the bonding layers, having a content ranging from 20 mass % to 40 mass % inclusive,
    wherein the bonding layers each have a two-layer structure of:
        a brazing material layer comprising the brazing material component but not the active metal, and
        an active metal compound layer containing the active metal, the active metal compound layer being formed along a bonded interface between the ceramic substrate and the bonding layer, and
    wherein, further, a ratio of a bonding area between the active metal compound layer and the ceramic substrate in a bonding area between each of the bonding layers and the ceramic substrate is 88% or more.

2. The ceramic circuit substrate according to claim 1, wherein at least one of Sn, In, Ni, Si, and Li is contained as the brazing material component.

3. The ceramic circuit substrate according to claim 1, wherein at least one of Ti, Zr, Hf, Nb, Ta, V, Cr, Y, Al, and Mo is contained as one of the active metals.

4. The ceramic circuit substrate according to claim 1, wherein a thickness of the active metal compound layer ranges, relative to each of the whole bonding layers, from 1/40 to 1/10 inclusive.

5. The ceramic circuit substrate according to claim 1, wherein a thickness of each of the bonding layers ranges from 5 μm to 50 μm inclusive.

6. The ceramic circuit substrate according to claim 1, wherein each of the bonding layers includes at least one of an Ag—Cu—Ti alloy, an Ag—Cu—Ti—Sn alloy, an Ag—Cu—Ti—Zr—Sn alloy, an Ag—Cu alloy, an Ag—Cu—Sn alloy, and an Ag—Cu—Zr alloy.

7. The ceramic circuit substrate according to claim 1, wherein the ceramic substrate is made of one of aluminum nitride, silicon nitride, alumina, zirconia, lanthanum boride, boron nitride, silicon carbide, and graphite.

8. A method for producing the ceramic circuit substrate according to claim 1, the method comprising:
    preparing a clad composite material containing, on a surface of a copper plate material comprising a copper-based material, an active metal brazing material in a bulk form having a brazing material component and an active metal alloyed;
    arranging the composite material on both of surfaces of a ceramic substrate to allow the active metal brazing material to abut the surfaces; and
    heating the composite material to melt the active metal brazing material to bond the copper plate material onto both of the surfaces of the ceramic substrate.

9. The method for producing the ceramic circuit substrate, according to claim 8, wherein the active metal brazing material comprises an Ag—Cu—Ti alloy, an Ag—Cu—Ti—Sn alloy, or an Ag—Cu—Ti—Zr—Sn alloy.

10. The method for producing the ceramic circuit substrate, according to claim 8, wherein a planar shape of the composite material to be bonded onto one of the surfaces of the ceramic substrate is machined into a circuit shape.

11. The ceramic circuit substrate according to claim 2, wherein at least one of Ti, Zr, Hf, Nb, Ta, V, Cr, Y, Al, and Mo is contained as one of the active metals.

12. The ceramic circuit substrate according to claim 2, wherein a thickness of the active metal compound layer ranges, relative to each of the whole bonding layers, from 1/40 to 1/10 inclusive.

13. The ceramic circuit substrate according to claim 3, wherein a thickness of the active metal compound layer ranges, relative to each of the whole bonding layers, from 1/40 to 1/10 inclusive.

14. The ceramic circuit substrate according to claim 2, wherein a thickness of each of the bonding layers ranges from 5 μm to 50 μm inclusive.

15. The ceramic circuit substrate according to claim 3, wherein a thickness of each of the bonding layers ranges from 5 μm to 50 μm inclusive.

16. The ceramic circuit substrate according to claim 2, wherein each of the bonding layers includes at least one of an Ag—Cu—Ti alloy, an Ag—Cu—Ti—Sn alloy, an Ag—Cu—Ti—Zr—Sn alloy, an Ag—Cu alloy, an Ag—Cu—Sn alloy, and an Ag—Cu—Zr alloy.

17. The ceramic circuit substrate according to claim 3, wherein each of the bonding layers includes at least one of an Ag—Cu—Ti alloy, an Ag—Cu—Ti—Sn alloy, an Ag—Cu—Ti—Zr—Sn alloy, an Ag—Cu alloy, an Ag—Cu—Sn alloy, and an Ag—Cu—Zr alloy.

18. The ceramic circuit substrate according to claim 2, wherein the ceramic substrate is made of one of aluminum nitride, silicon nitride, alumina, zirconia, lanthanum boride, boron nitride, silicon carbide, and graphite.

19. A method for producing the ceramic circuit substrate according to claim 2, the method comprising:
   preparing a clad composite material containing, on a surface of a copper plate material comprising a copper-based material, an active metal brazing material in a bulk form having a brazing material component and an active metal alloyed;
   arranging the composite material on both of surfaces of a ceramic substrate to allow the active metal brazing material to abut the surfaces; and
   heating the composite material to melt the active metal brazing material to bond the copper plate material onto both of the surfaces of the ceramic substrate.

20. The method for producing the ceramic circuit substrate, according to claim 9, wherein a planar shape of the composite material to be bonded onto one of the surfaces of the ceramic substrate is machined into a circuit shape.

\* \* \* \* \*